(12) United States Patent
Radkevich et al.

(10) Patent No.: US 7,396,404 B2
(45) Date of Patent: Jul. 8, 2008

(54) METHODS FOR FORMING ALKALI HALIDE INGOTS INTO RECTANGULAR PLATES

(75) Inventors: Olexy V. Radkevich, Schaumburg, IL (US); Efim Toutchinskii, Streamwood, IL (US); Yuriy Yakovlev, Palatine, IL (US); Robert S. Zwolinski, Elmhurst, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 11/600,972

(22) Filed: Nov. 17, 2006

(65) Prior Publication Data

US 2008/0115721 A1    May 22, 2008

(51) Int. Cl.
*C30B 25/12* (2006.01)
*C30B 25/14* (2006.01)

(52) U.S. Cl. .............................. 117/2; 117/3; 117/902; 117/937; 117/940

(58) Field of Classification Search .................. 117/2, 117/3, 902, 937, 940
See application file for complete search history.

(56) References Cited

U.S. PATENT DOCUMENTS 5,792,253 A * 8/1998 Eidelman et al. ............... 117/2
6,224,666 B1 * 5/2001 Zwolinski et al. .............. 117/3

* cited by examiner

*Primary Examiner*—Felisa C Hiteshew

(57) ABSTRACT

The present disclosure provides methods for forging cylindrical alkali halide melt-grown single-crystal-type ingots into rectangular blocks. The resulting rectangular blocks are devoid of peripheral cracks and fissures, and possess uniform properties and reduced levels of impurities.

20 Claims, 3 Drawing Sheets

US 7,396,404 B2

METHODS FOR FORMING ALKALI HALIDE INGOTS INTO RECTANGULAR PLATES

BACKGROUND

The present disclosure relates to alkali halide scintillation crystals, and more particularly to methods by which alkali halide scintillation crystals may be manufactured. In embodiments, the present disclosure relates to hot forging of NaI(Tl) scintillation crystals to produce scintillators having a large area, a rectangular shape, and uniform properties.

Manufacturers of alkali halide crystals (including NaI(Tl) crystals) have long attempted to enlarge and shape melt-grown crystal ingots by forging them at elevated temperatures. Crystal forging techniques are taught, for example, in U.S. Pat. Nos. 3,933,970 and 4,171,400. These patents disclose hot forging in which there is a gradual compression of the crystal ingot between two surfaces. If a cylindrical ingot is flattened parallel to its axis, the forging process produces a disk-shaped crystal having a circular cross-section; if the cylindrical ingot is flattened perpendicular to its axis, the forging process produces a parallelepiped-shaped crystal having a rectangular cross-section. One problem with these processes is they may produce forged crystals having cracks and fissures at and adjacent the periphery of the crystal. As a result, the peripheral region of the forged crystal is not useful and must be cut away. This limits the size of the crystals that can be produced using the forging process. It also reduces the yield of the process because only a fraction of the forged crystal is useful with the rest being discarded or recycled.

U.S. Pat. No. 5,792,253, the entire disclosure of which is incorporated by reference herein, discloses a method of forging a cylindrical ingot of an alkali halide. A melt-grown ingot is flatted parallel both to its axis and to a particular crystallographic plane; the particular plane is determined by the crystal structure of the alkali halide to be forged. Then, the flat is placed on the lower platen of a heated dual-platen press and the ingot is compressed (advantageously, by raising the lower platen) between the platens while in a plastic state. The method produces a forged ingot in which cracks and fissures are absent from the periphery of the ingot.

Similarly, U.S. Pat. No. 6,224,666, the entire disclosure of which is incorporated by reference herein, discloses methods for forging cylindrical ingots of an alkali halide. In this case, the melt-grown alkali halide ingot is still heated to plasticity and compressed between the heated platens of a dual-platen press but, before the compression begins, the ingot is placed mid-way between two parallel, planar, and vertically extending barriers. The ingot is positioned so that its axis is vertical and so that the barriers are maintained in a predetermined relationship with the crystal lattice structure of the ingot. Then, the ingot is compressed along its axis to form a block.

The above-processes may avoid problems with cracks and fissures forming at and adjacent the periphery of the crystal.

In some instances, the prior art methods include the application of layers of fiberglass cloth impregnated with boron nitride on the platens to prevent the cloth from sticking to the ingot. One problem with this approach is fibers from the fiberglass cloth may become embedded in the ingot, thereby forming impurities in the resulting crystal and rectangular plates.

It would be desirable to develop methods for forming rectangular scintillators having a large area, rectangular shape, and uniform properties with reduced impurities.

SUMMARY

The present disclosure provides methods for forging generally cylindrical alkali halide single-crystal-type ingots of a crystal material having a crystallographic structure of a face-centered lattice type. In embodiments, the ingots have an axis generally coinciding with the crystallographic direction. The methods include placing the ingot upon a lower platen of a press having parallel upper and lower platens each covered with a metal foil so that the ingot is between two parallel, planar, vertically extending barriers located between and perpendicular to said upper and lower platens, orienting the ingot so that its axis is vertical, the ingot is mid-way between the barriers, and one of the ingot's crystallographic planes is parallel to the barriers, heating the ingot to a temperature below the melting point of the alkali halide, compressing the ingot along its axis by moving at least one of the upper and lower platens toward the other platen and compressing the ingot therebetween, and maintaining the barriers in fixed relation to each other.

In embodiments, the methods of the present disclosure may be used for forging a generally cylindrical alkali halide single-crystal-type ingot of a crystal material having a crystallographic structure of a body-centered lattice type, the ingot having an axis generally coinciding with the crystallographic direction. The methods include placing the ingot upon a lower platen of a press having parallel upper and lower platens each covered with a metal foil so that the ingot is between two parallel, planar, vertically extending barriers located between and perpendicular to said upper and lower platens, orienting the ingot so that its axis is vertical, the ingot is mid-way between the barriers, and one of the ingot's crystallographic planes is parallel to the barriers, heating the ingot to a temperature below the melting point of the alkali halide, compressing the ingot along its axis by moving at least one of the upper and lower platens toward the other platen and compressing the ingot therebetween, and maintaining the barriers in fixed relation to each other.

In yet other embodiments, the methods of the present disclosure may be used for forging a generally cylindrical alkali halide single-crystal-type ingot of a crystal material having a crystallographic structure selected from the group consisting of a face-centered lattice type and a body-centered lattice type, the ingot having an axis generally coinciding with the crystallographic direction. The methods may include placing the ingot upon a lower platen of a press having parallel upper and lower platens each covered with a metal foil selected from the group consisting of aluminum, stainless still, nickel, and combinations thereof so that the ingot is between two parallel, planar, vertically extending barriers located between and perpendicular to said upper and lower platens, orienting the ingot so that its axis is vertical, so that the ingot is mid-way between the barriers and one of the ingot's crystallographic planes is parallel to the barriers, heating the ingot to a temperature below the melting point of the alkali halide for a period of time of about 4 days, compressing the ingot along its axis by moving at least one of the upper and lower platens toward the other platen and compressing the ingot therebetween for a period of time of about 5 hours, maintaining the barriers in fixed relation to each other, and cooling the ingot to room temperature for a period of time of about 4 days.

BRIEF DESCRIPTION OF THE DRAWINGS

The present disclosure will be better understood with reference to the following illustrative and non-limiting drawings, in which.

DETAILED DESCRIPTION

Figure 1:
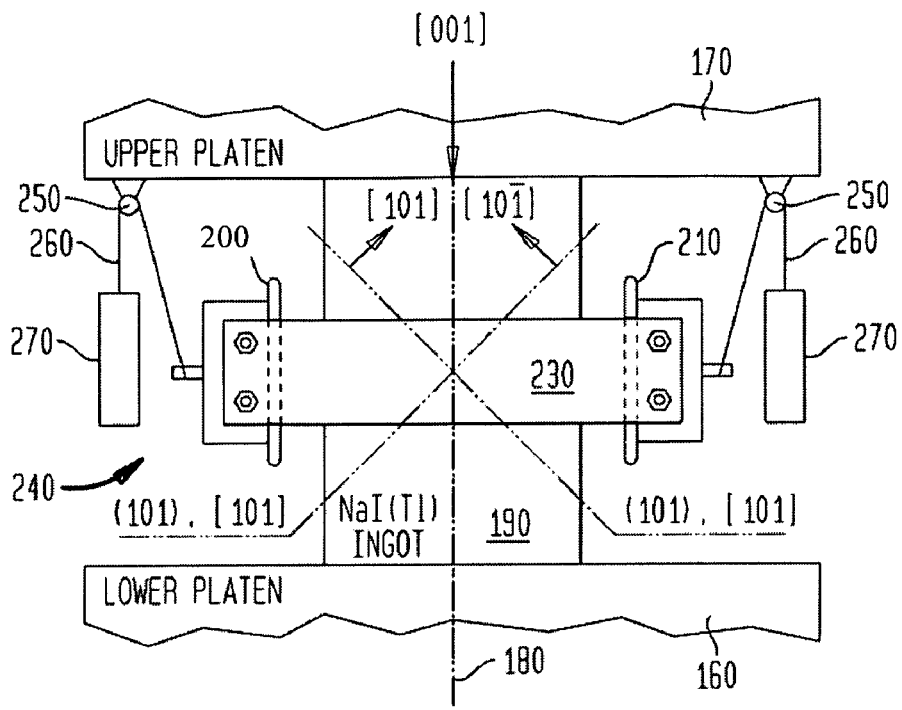
FIGS. 1 and 2 schematically illustrate an apparatus used in accordance with an embodiment of the present disclosure to form a rectangular plate.

In accordance with the present disclosure, a single-crystal-type ingot may be compressed in a particular direction with respect to its crystallographic structure. Following the methods of the present disclosure, peripheral cracking and fissuring may be completely eliminated. Although a single crystal ingot may be advantageous, it is not essential that the entire ingot be a single crystal. It is alternatively possible to use a crystal ingot that has a relatively small number of crystals, as long as it is possible, in an overall sense, to orient the crystallographic structure of the ingot with respect to the axis of compression. Hereinafter, the term "single-crystal-type" is used to refer to ingots that are either single crystals or that are made up of a relatively small number of crystals.

While the description below focuses upon forging NaI, particularly TI-doped NaI (NaI(TI)), which is a suitable scintillator for a scintillation camera, it is also possible to forge other alkali halide ingots using the methods of the present disclosure. NaI has a crystallographic structure of the face-centered lattice type. Other alkali halide crystals having the crystallographic structure of a face-centered lattice can be forged in the same way or in a similar way. Furthermore, it is also possible to forge alkali halide crystals having crystallographic structures of the body-centered lattice type (CsI is an example) in the same way or in a similar way. One skilled in the art would be able to do so based upon the information set forth below without having to resort to excessive or undue experimentation.

As disclosed in U.S. Pat. No. 5,792,253, a melt-grown single-crystal-type alkali halide ingot can be forged into a block. The ingot may have a cylindrical shape while the resulting forged crystal may have a rectangular cross-section. The ingot may be grown from a melt containing the alkali halide, for example NaI and a relatively small doping of TI activator. One potential problem with the use of an activator such as TI is that the concentration of TI in the melt can vary during the growth process and thus the concentration of TI in the growing ingot can similarly vary. U.S. Pat. No. 6,224,666 addresses this problem and the lack of homogeneity which may exist in alkali halide ingots through the use of the apparatus and methods disclosed therein to form scintillation crystals.

The present disclosure provides additional apparatus and methods for forming crystals from alkali halides. In accordance with the present disclosure, an alkali halide ingot may be heated to a temperature below its melting point, with pressure applied along axis 180 of the ingot 190 while the ingot is in a plastic state. (See FIGS. 1 and 2). For an ingot 190 of a face-centered alkali halide such as NaI(TI), the ingot 190 may be compressed while at a temperature of from about 450° C. to about 550° C., in some embodiments from about 475° C. to about 500° C., and the axis 180 of the ingot 190 will substantially coincide with the [001] crystallographic direction. For an ingot 190 of a body-centered alkali halide such as CsI, the ingot 190 will be compressed while at a temperature of from about 400° C. to about 490° C., in some embodiments from about 420° C. to about 470° C., and the axis 180 of the ingot 190 will substantially coincide with the [011] crystallographic direction.

In accordance with the present disclosure, compression may take place while the ingot 190 is located mid-way between two parallel, planar, vertically extending barriers 200 and 210, that are oriented to have a predetermined relationship with the crystallographic structure of the ingot 190. If the ingot 190 has a face-centered lattice (such as NaI), the barriers 200 and 210 may be arranged to be parallel to either the (100) crystallographic plane or the (010) crystallographic plane (these two planes are longitudinal crystallographic planes of the ingot 190). If the ingot 190 has a body-centered lattice (such as CsI), the barriers 200 and 210 may be arranged to be parallel to the (100) longitudinal crystallographic plane. Advantageously, the barriers 200 and 210 may be maintained in fixed relation by transversely extending frame elements 220 and 230. The distance between the barriers 200 and 210 may be less than the distance between the frame elements 220 and 230, so all the elements together form a rectangular frame generally indicated by reference numeral 240. The frame 240 has interior dimensions generally corresponding to those of the generally rectangular block into which the ingot 190 is to be forged and bounds an interior volume generally corresponding to that of the ingot 190.

As can be seen in FIG. 1, if the cylindrical single-crystal-type NaI(TI) ingot 190 is placed in a dual platen press with the [001] ingot axis normal to the platens 160 and 170, both the slip directions [101], [10$\bar{1}$] and the normals to the planes (101), (10$\bar{1}$) of easy slip are inclined at angles of about 45 degrees to the compression axis [001]. The same is true for directions [011], [01$\bar{1}$] (not shown) and planes of easy slip (011), (01$\bar{1}$) (also not shown). Therefore, as explained in U.S. Pat. No. 5,792,253, a compression of the ingot between the lower platen 160 and the upper platen 170 will cause a deformation in which only four of the six possible planes of the system of easy slip {011}<01> participate. In all other slip systems shear stresses will be significantly less so that such other slip systems will be inactive. Hence, deformation of the ingot 190 occurs only along particular directions, thereby preventing the uncontrolled type of deformation that causes cracking and fissuring.

Figure 2:
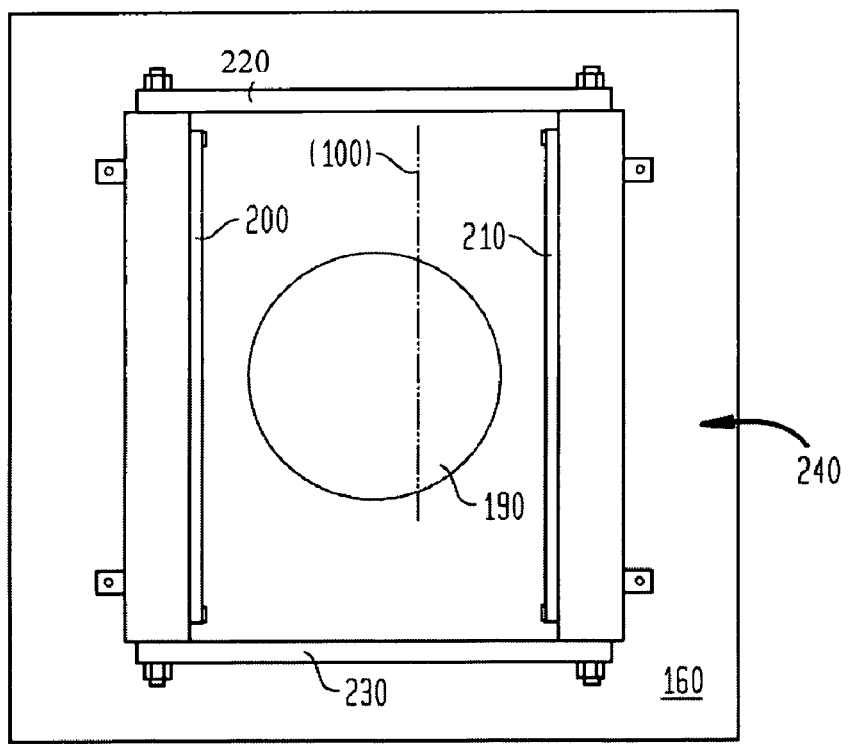
Figure 4:
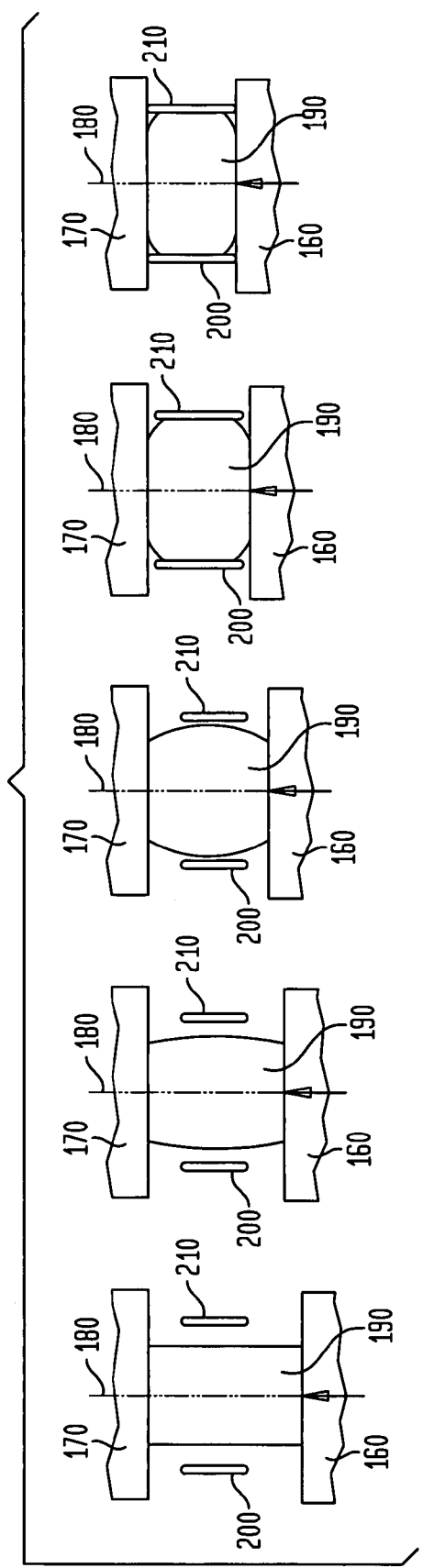
FIGS. 4 and 5 schematically illustrate forging of an ingot in accordance with an embodiment of the present disclosure.
Figure 5:
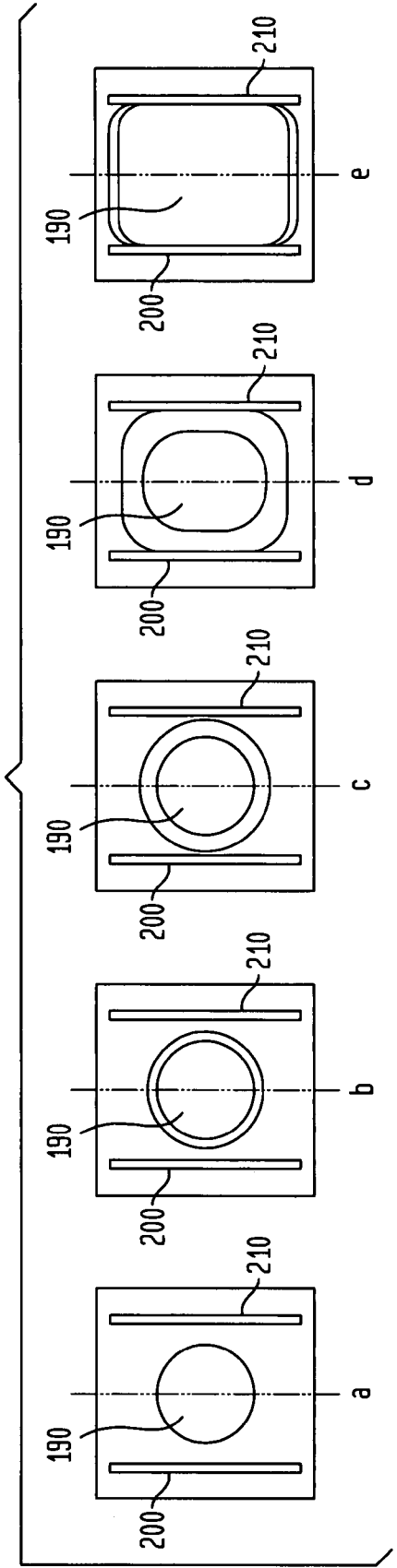

In accordance with one embodiment, and as illustrated in FIG. 2, for a NaI(TI) ingot or other alkali halide with a face-centered crystal lattice, the barriers 200 and 210 may be parallel to one of the two longitudinal {100} crystallographic planes of the ingot, i.e., either to the (100) crystallographic plane (shown in FIG. 2) or to the (010) crystallographic plane. If the ingot is of CsI or other alkali halide having a body-centered crystal lattice, the barriers 200 and 210 would be oriented parallel to the (100) crystallographic plane. As compression of the ingot 190 continues, the ingot 190 becomes progressively more barrel-shaped (see FIGS. 4 and 5) and eventually touches the barriers 200 and 210. The ingot is thus compressed along its axis to form a block. If the ingot is NaI, this axis may generally coincide with the [001] crystallographic direction. If the ingot is of CsI, the axis of compression may generally coincide with the [011] crystallographic direction. Once the ingot touches barriers 200 and 210, the barriers 200 and 210 begin to block deformation along the orthogonal planes of easy slip (101), (10$\bar{1}$), while deformation along the other planes of easy slip (011'), (01$\bar{1}$) continues until compression of the ingot 190 ceases.

As the ingot is compressed along the direction in which any inhomogeneities therein have the most pronounced effect on the characteristics of the ingot, the resulting block may be more uniform along its length and width. The block is therefore more likely to produce scintillation crystals suitable for use in scintillation cameras.

As can be seen in FIG. 1, the frame 240 may be suspended from the upper platen 170 by a counterweighted system that includes pulleys 250, cables 260, and counterweights 270. This configuration assists in keeping the frame aligned with the thickest portion of the ingot as the forging process proceeds. Each cable 260 passes through a pulley 250 and may be attached at one end to the frame 240 and at the other end to a counterweight 270. This arrangement keeps the barriers 200 and 210 approximately centered with respect to the center of the barrel-shaped ingot 190. As a result, the widest part of the ingot 190 does not become located above or below the barriers 200 and 210 and thus is not cut off as compression continues. The height of the barriers 200 and 210 determines the minimum distance between the lower platen 160 and the upper platen 170, i.e., the thickness of the ingot 190 in its finally forged state. In embodiments, the top and bottom edges of the barriers 200 and 210 may be rounded. This makes it possible to cut off any portions of the ingot 190 that get caught between one of the platens 160, 170 and one of the barriers 200, 210 during the forging process.

In embodiments, the dimensions of the frame 240 may be chosen so that the frame 240 is slightly longer than the final length of the block into which the ingot 190 is forged, and bounds an interior volume that is slightly larger than the volume of the ingot 190. This may facilitate production of rectangular NaI(TI) gamma camera scintillation crystals that are each about 590.6 mm long by about 444.5 mm wide by about 9.5 mm thick. To that end, a melt-grown cylindrical NaI(TI) ingot 190 that has a diameter from about 430 mm to about 450 mm and a length from about 520 mm to about 575 mm may be forged into a block that is about 660 mm long (between the frame elements 220 and 230) about 520 mm wide (between the barriers 200 and 210) and from about 230 mm to about 240 mm thick (the height of the barriers 200 and 210). The distances between the barriers and frames may be determined by the size of initial ingot and by the size of the desired ingot after forging. The forged block can then be subdivided (as by sawing, not shown) into fifteen to eighteen plates (not shown), each having the intended dimensions, in embodiments each being about 590.6 mm long by about 444.5 mm wide by about 9.5 mm thick. Each of these plates is suitable for use as a scintillator in the detector of a scintillation camera.

While the above description includes dimensions for a specific size camera plate, one skilled in the art may readily envision alternate dimensions and thus the above description of specific dimensions should not limit the present disclosure.

Figure 3:
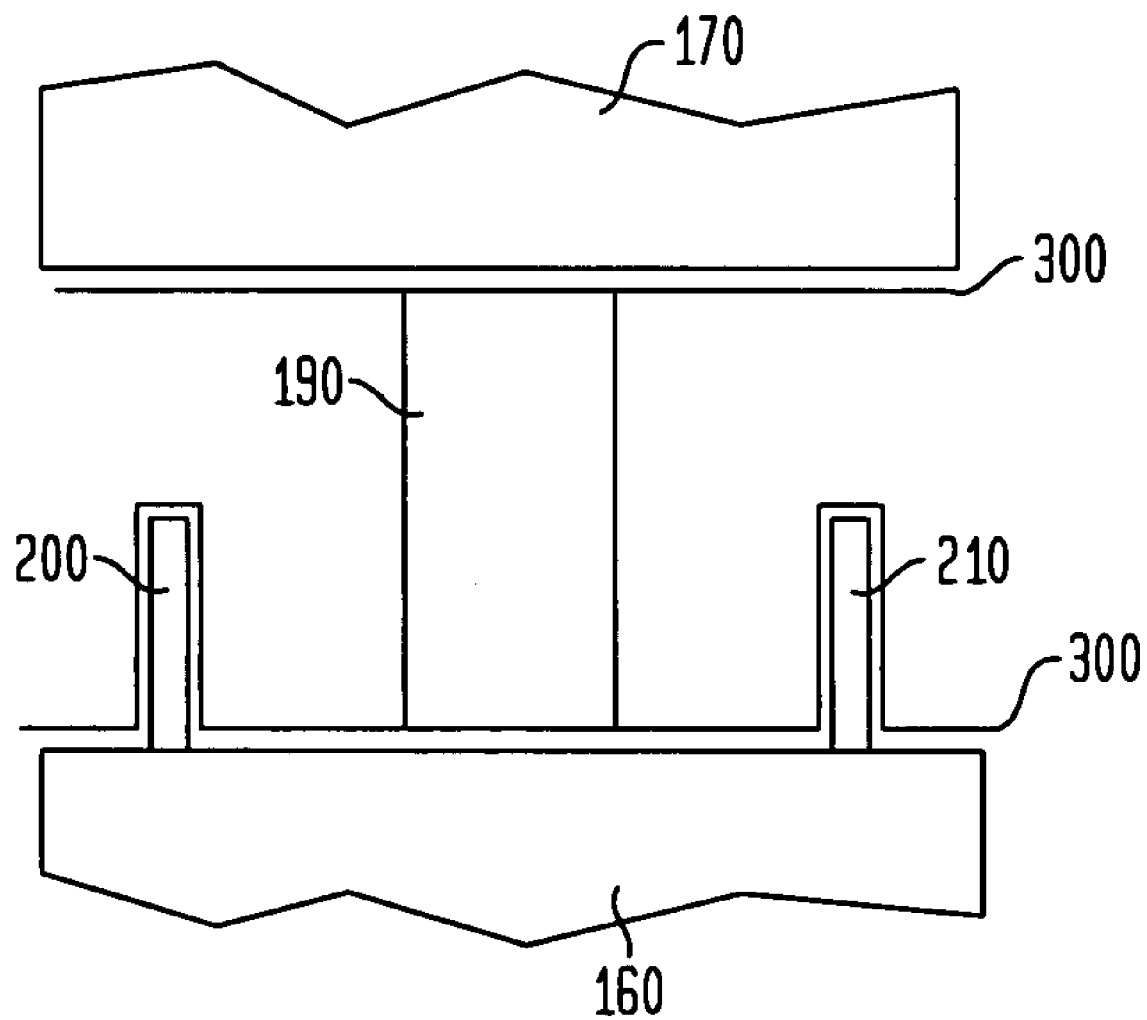
FIG. 3 schematically illustrates an alternate apparatus of the present disclosure.

As noted above, while some prior art methods and apparatus included layers of fiberglass cloth impregnated with boron nitride on the platens to prevent the cloth from sticking to the ingot 190, the boron nitride could become embedded in the ingot, thereby forming impurities in the resulting crystal and rectangular plates. In accordance with the present disclosure, as depicted in FIG. 3, the platens 160, 170 may possess a layer of a metallic foil 300 on their surfaces adjacent the ingot. In embodiments, barriers 200, 210 may also possess a layer of a metallic foil 300 on their surfaces adjacent the ingot. Such metallic foils may advantageously be used to prevent the ingot 190 from touching any of the surfaces of the platens 160 and 170, the barriers 200 and 210, or both, without the introduction of impurities in the resulting crystal and rectangular plates. As depicted in FIG. 3, the metallic foil 300 may be a single layer or, in embodiments, it may possess a multi-layer configuration (not shown).

Suitable metallic foils which may be utilized to cover the platens, the barriers, or both, include those formed from aluminum, stainless still, nickel, and combinations thereof.

In embodiments, it may be advantageous to heat and cool the ingot 190 slowly. For a NaI(TI) ingot 190 having a diameter from about 430 mm to about 450 mm and a length from about 520 mm to about 575 mm in length, it may be desirable to heat the ingot to a temperature from about 20° C. to about 600° C., in embodiments from about 40° C. to about 550° C., over a period of time of from about two days to about six days, in embodiments from about three days to about five days, in embodiments about four days. It may also be desirable to compress the ingot it by raising the lower platen 160 towards the upper platen 170 over a period of time from about three hours to about seven hours, in embodiments from about four hours to about six hours, in some cases for about five hours, using a pressure of from about 120 tons to about 175 tons, to cool the forged block to about 60° C. over a period of time from about two days to about six days, in embodiments from about three days to about five days, in some cases for about four days after compression has been completed, and to self-cool the forged block to room temperature over an additional period of time, in embodiments from about two to about three days.

An alternative embodiment may be utilized where the ingot 190 is substantially narrower at one end. In this instance, the ingot 190 may become barrel-shaped, not at its center but, instead, closer to its wider end during the compression process. When the ingot 190 has this inhomogeneous shape, the wider end may be placed on the lower platen 160, so that the narrower end is compressed by the upper platen 170, and the frame 240 rests upon the lower platen 160 while the ingot 190 is being compressed.

Alternatively, if the ingot is supported on the lower platen and its upper end is substantially narrower than its lower end (as is the case when the growth process comprises gradual broadening of the ingot in the first stage or gradual narrowing of the ingot in the final stage) the frame can be placed on the lower platen and can rest upon the lower platen as compression proceeds. As noted above, while it may be desirable for the ingot to be pulled from the melt as a single crystal, i.e. having an unvarying crystallographic structure, this is not absolutely necessary. Ingots made up of more than one crystal can also be forged. Such forging can be done as long as it is possible, in an overall sense, to orient the crystallographic structure of the ingot with respect to the axis of compression, i.e. as long as all the crystals are not severely misaligned with respect to each other.

The resulting forged ingot has a generally rectangular cross-section and is devoid of peripheral cracks and fissures.

As mentioned above, CsI and other alkali halide single crystals having a body centered lattice can also be forged in the same way or in a similar way. As compared with NaI, such crystals have the same crystallographic planes of easy slip {110}, but other slip directions <100>. In accordance with this characteristic, a flat on the side of a cylindrical CsI single-crystal-type ingot, having its axis along the [001] crystallographic direction, should be cut parallel to the crystallographic plane (110), resulting in an angle of about 45 degrees between the compression axis and the slip directions. Suitable plasticity of CsI can be achieved by heating the CsI to a temperature of from about 400° C. to about 490° C., in embodiments from about 420° C. to about 470° C.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method of forging a generally cylindrical alkali halide single-crystal ingot of a crystal material having a face-centered lattice crystallographic structure, the ingot having an axis generally coinciding with the crystallographic direction, comprising:
    placing the ingot upon a lower platen of a press having parallel upper and lower platens each covered with a metal foil so that the ingot is between two parallel, planar, vertically extending barriers located between and perpendicular to said upper and lower platens;
    orienting the ingot so that its axis is vertical, the ingot is mid-way between the barriers, and one of the ingot's crystallographic planes is parallel to the barriers;
    heating the ingot to a temperature below the melting point of the alkali halide;
    compressing the ingot along its axis by moving at least one of the upper and lower platens toward the other platen and compressing the ingot therebetween; and
    maintaining the barriers in fixed relation to each other.

2. The method of claim 1, further comprising cooling the ingot to room temperature.

3. The method of claim 2, wherein the heating step is carried out over about 4 days, the compressing step is carried out over about 5 hours, and the cooling step is carried out over about 4 days.

4. The method of claim 1, wherein the metal foil is selected from the group consisting of aluminum, stainless still, nickel, and combinations thereof.

5. The method of claim 1, wherein the barriers are suspended between said lower platen and said upper platen.

6. The method of claim 5, wherein the barriers are maintained in fixed relation by transversely extending frame elements to form a rectangular frame having interior dimensions generally corresponding to those to which the ingot is to be forged and having an interior volume generally corresponding to that of the ingot.

7. The method of claim 1, wherein the barriers rest upon the lower platen.

8. The method of claim 1, wherein the ingot is compressed from an initial diameter of from about 430 mm to about 450 mm and an initial length of from about 520 mm to about 575 mm to a generally rectangular shape having a final thickness of from about 230 mm to about 240 mm.

9. The method of claim 1, wherein the alkali halide is sodium iodide and said temperature is from about 450° C. to about 550° C.

10. A method of forging a generally cylindrical alkali halide single-crystal ingot of a crystal material having a body-centered lattice crystallographic structure, the ingot having an axis generally coinciding with the crystallographic direction, comprising:
    placing the ingot upon a lower platen of a press having parallel upper and lower platens each covered with a metal foil so that the ingot is between two parallel, planar, vertically extending barriers located between and perpendicular to said upper and lower platens;
    orienting the ingot so that its axis is vertical, the ingot is mid-way between the barriers, and one of the ingot's crystallographic planes is parallel to the barriers;
    heating the ingot to a temperature below the melting point of the alkali halide;
    compressing the ingot along its axis by moving at least one of the upper and lower platens toward the other platen and compressing the ingot therebetween; and
    maintaining the barriers in fixed relation to each other.

11. The method of claim 10, further comprising cooling the ingot to room temperature.

12. The method of claim 11, wherein the heating step is carried out over about 4 days, the compressing step is carried out over about 5 hours, and the cooling step is carried out over about 4 days.

13. The method of claim 10, wherein the metal foil is selected from the group consisting of aluminum, stainless still, nickel, and combinations thereof.

14. The method of claim 10, wherein the barriers are suspended between said lower platen and said upper platen.

15. The method of claim 14, wherein the barriers are maintained in fixed relation by transversely extending frame elements to form a rectangular frame having interior dimensions generally corresponding to those to which the ingot is to be forged and having an interior volume generally corresponding to that of the ingot.

16. The method of claim 10, wherein the barriers rest upon the lower platen.

17. The method of claim 10, wherein the ingot is compressed from an initial diameter of from about 430 mm to about 450 mm and an initial length of from about 520 mm to about 575 mm to a generally rectangular shape having a final thickness of from about 230 mm to about 240 mm.

18. A method of claim 10, wherein the alkali halide is cesium iodide and said temperature is from about 400° C. to about 490° C.

19. A method of forging a generally cylindrical alkali halide single-crystal ingot of a crystal material having a crystallographic structure selected from the group consisting of a face-centered lattice crystallographic structure and a body-centered lattice crystallographic structure, the ingot having an axis generally coinciding with the crystallographic direction, comprising:
    placing the ingot upon a lower platen of a press having parallel upper and lower platens each covered with a metal foil selected from the group consisting of aluminum, stainless still, nickel, and combinations thereof so that the ingot is between two parallel, planar, vertically extending barriers located between and perpendicular to said upper and lower platens;
    orienting the ingot so that its axis is vertical, so that the ingot is mid-way between the barriers and one of the ingot's crystallographic planes is parallel to the barriers;
    heating the ingot to a temperature below the melting point of the alkali halide for a period of time of about 4 days;
    compressing the ingot along its axis by moving at least one of the upper and lower platens toward the other platen and compressing the ingot therebetween for a period of time of about 5 hours;
    maintaining the barriers in fixed relation to each other; and
    cooling the ingot to room temperature for a period of time of about 4 days.

20. The method of claim 19, wherein the alkali halide is selected from the group consisting of sodium iodide and cesium iodide and the ingot is compressed from an initial diameter of from about 430 mm to about 450 mm and an initial length of from about 520 to about 575 mm to a generally rectangular shape having a final thickness of from about 230 mm to about 240 mm.

* * * * *